(12) United States Patent
Yeh

(10) Patent No.: US 10,062,676 B1
(45) Date of Patent: Aug. 28, 2018

(54) MULTILAYER CHIPSET STRUCTURE

(71) Applicant: Hsiu Hui Yeh, Taipei (TW)

(72) Inventor: Hsiu Hui Yeh, Taipei (TW)

( * ) Notice: Subject to any disclaimer, the term of this patent is extended or adjusted under 35 U.S.C. 154(b) by 0 days.

(21) Appl. No.: 15/604,659

(22) Filed: May 25, 2017

(51) Int. Cl.
| | | |
|---|---|---|
| *H01L 25/18* | (2006.01) | |
| *H01L 23/498* | (2006.01) | |
| *H01L 23/00* | (2006.01) | |
| *H01L 23/13* | (2006.01) | |
| *H01L 23/31* | (2006.01) | |

(52) U.S. Cl.
CPC ............ *H01L 25/18* (2013.01); *H01L 23/13* (2013.01); *H01L 23/3121* (2013.01); *H01L 23/49811* (2013.01); *H01L 23/49822* (2013.01); *H01L 23/49833* (2013.01); *H01L 23/49838* (2013.01); *H01L 24/05* (2013.01); *H01L 24/49* (2013.01); *H01L 2224/04042* (2013.01); *H01L 2224/45144* (2013.01); *H01L 2224/45147* (2013.01); *H01L 2224/48091* (2013.01); *H01L 2224/48101* (2013.01); *H01L 2224/48106* (2013.01); *H01L 2224/48157* (2013.01); *H01L 2224/48227* (2013.01); *H01L 2224/49505* (2013.01); *H01L 2924/143* (2013.01); *H01L 2924/1438* (2013.01)

(58) Field of Classification Search
CPC ............... H01L 23/13; H01L 23/3121; H01L 23/49811; H01L 23/49822; H01L 23/49833; H01L 23/49838; H01L 24/05; H01L 24/49
See application file for complete search history.

(56) References Cited

U.S. PATENT DOCUMENTS

| | | | | |
|---|---|---|---|---|
| 5,136,271 | A * | 8/1992 | Nishioka | ........... H01L 23/49822 257/E23.062 |
| 6,104,089 | A * | 8/2000 | Akram | .................... H01L 23/13 257/679 |
| 9,543,277 | B1* | 1/2017 | Lee | ...................... H01L 25/0657 |
| 2009/0032973 | A1* | 2/2009 | Sasaki | ................. H01L 25/0657 257/777 |
| 2011/0298139 | A1* | 12/2011 | Lai | .......................... H01L 23/13 257/774 |

\* cited by examiner

*Primary Examiner* — Peniel M Gumedzoe

(57) ABSTRACT

A multilayer chipset structure is provided. The chips can be arranged in a stacking structure with multilayer circuit board. Each circuit board is formed with wiring opening and chipset opening. The chipset opening can be arranged with at least one chipset, such as a controller. The different openings cause connecting wires can pass therethrough so as to connect different chips or circuit elements on different layer. By this modularized structure, the multilayer package structure can be formed with a complicated structure in one package so as to reduce the packaging cost effectively. The connecting wires pass through the openings so as to reduce the whole path lengths needed. No complicated wiring is needed. All the conducting wires are at an upper side of the chips. In packaging, it only needs to package the upper side.

9 Claims, 7 Drawing Sheets

MULTILAYER CHIPSET STRUCTURE

FIELD OF THE INVENTION

The present invention is related to chip packaging, and in particular to a multilayer chipset structure.

BACKGROUND OF THE INVENTION

In prior art semiconductor multilayer packaging structures, welding pads are welded on upper sides of circuit boards and chips. Conduction wires are used to connect the circuit boards and chips. Then packaging structures are added. In the prior art, to suit for the welding pads on different circuits, the conduction wires are wound and curved and are arranged on different positions of the circuit boards. As a result, it makes the works become difficult and times for assembling are increased dramatically. Furthermore, in packing, epoxy must be added to different surface and thus the thickness of the whole structure increases so that the assembly time and cost increase and heat dissipation effect reduces.

Therefore there is an eager demand for a novel structure which can decrease the complicated winding structure and thus reduce the assembly time and cost.

SUMMARY OF THE INVENTION

To improve above mentioned defects in the prior art, the present invention provides a multilayer chipset structure, wherein the chips can be arranged in a stacking structure with multilayer circuit board. Each circuit board is formed with wiring opening and chipset opening. The chipset opening can be arranged with at least one chipset, such as a controller. The different openings cause connecting wires can pass therethrough so as to connect different chips or circuit elements on different layer. By this modularized structure, the multilayer package structure can be formed with a complicated structure in one package so as to reduce the packaging cost effectively. Furthermore, in the present invention, the connecting wires pass through the openings so as to reduce the whole path lengths needed. In the present invention, all the conducting wires are at an upper side of the chips. In packaging, it only needs to package the upper side (such as sealing with epoxy). Packaging at other sides may be neglected.

To achieve above object, the present invention provides a multilayer chipset structure comprising: a chip circuit layer (100) containing: a first chip (10) having a plurality of welding pads (101) on a surface thereof for connecting external conducting wires; a first circuit board (20) being positioned above the first chip (10); the first circuit board (20) including at least one wiring opening (21) and at least one chipset opening (22); after the first circuit board (20) being combined with the first chip (10), the welding pads (101) on the first chip (10) exposing out from the wiring opening 21; a first chipset (25) being placed in the chipset opening (22); the first chipset being arranged with a plurality of welding pads (251); after the first circuit board (20) being combined with the first chip (10), the first chipset (25) exposing out from the chipset opening (22); and wherein the first circuit board (20) is formed with a plurality of welding pads (211) near the wiring opening (21) of the first circuit board (20); first conducting wires (215) are connected between the welding pads (101) of the first chip (10) and the welding pads (211) of the first circuit board (20) so as to have the function of power and signal connections; and the first circuit board (20) is formed with a plurality of welding pads (221) near the chipset opening (22); second conducting wires (225) serve to connect the welding pads (221) of the first circuit board (20) and the welding pads (251) of the first chipset (25) so as to have the functions of power and signal connection.

The chip circuit layer (100) further comprises: at least one second circuit board (30) being installed above the first circuit board (20); the second circuit board (30) including at least one wiring opening (31) and at least one chipset opening (32); the wiring opening (31) of the second circuit board (30) serving to expose the welding pads (201) of the first circuit board (20) after the second circuit board (30) combines with the first circuit board (20); a second chipset (35) being arranged on the chipset opening (32) of the second circuit board (30); the second chipset (35) being arranged with a plurality of welding pads (351); the second chipset (35) exposing out from the chip set opening (32) of the second circuit board (30) after the second circuit board (30) is combined with the first circuit board (20); wherein a plurality of welding pads (311) are arranged on the second circuit board (30) near the wiring opening (31) of the second circuit board (30); third conducting wires (315) serving to connect the welding pads (311) on the second circuit board (30) with the welding pads (301) of the first circuit board (20) for signal and electrical connections; and a plurality of welding pads (321) are arranged on the second circuit board (30) near the chipset opening (32) of the second circuit board (30); fourth conducting wires (325) serving to connect the welding pads (321) on the second circuit board with the welding pads (351) of the second chipset (35) for signal and electrical connections.

DETAILED DESCRIPTION OF THE INVENTION

DETAILED DESCRIPTION OF THE INVENTION

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
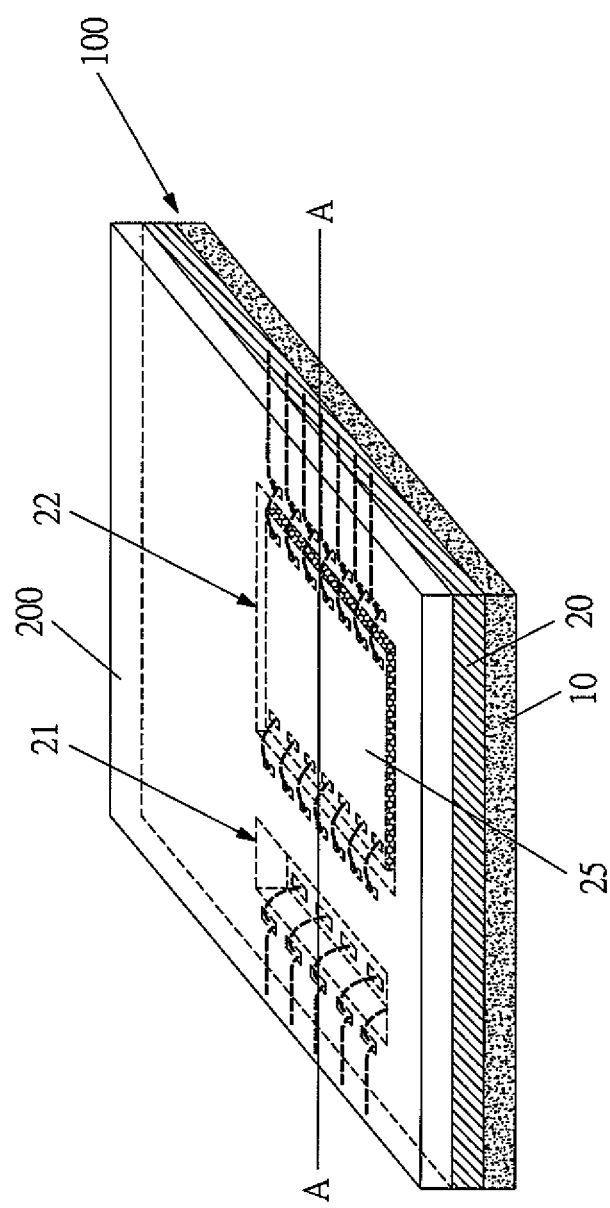
FIG. 1 is an assembled schematic view of the elements in the first embodiment of the present invention.
Figure 2:
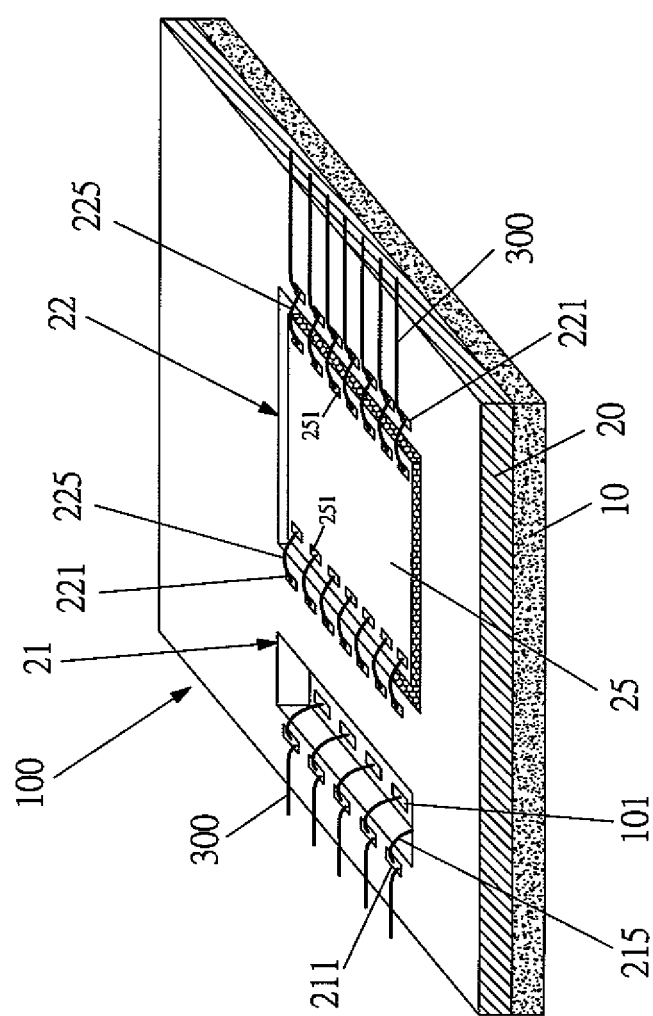
FIG. 2 is a schematic view showing the layout of the chipset in the first embodiment of the present invention.
Figure 3:
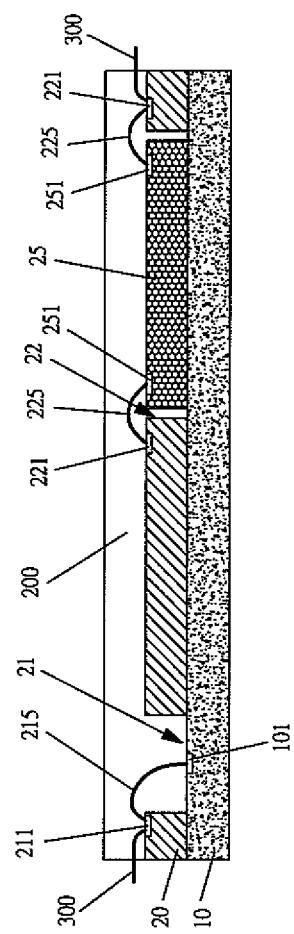
FIG. 3 is a schematic view viewed from line A-A in FIG. 1.
Figure 4:
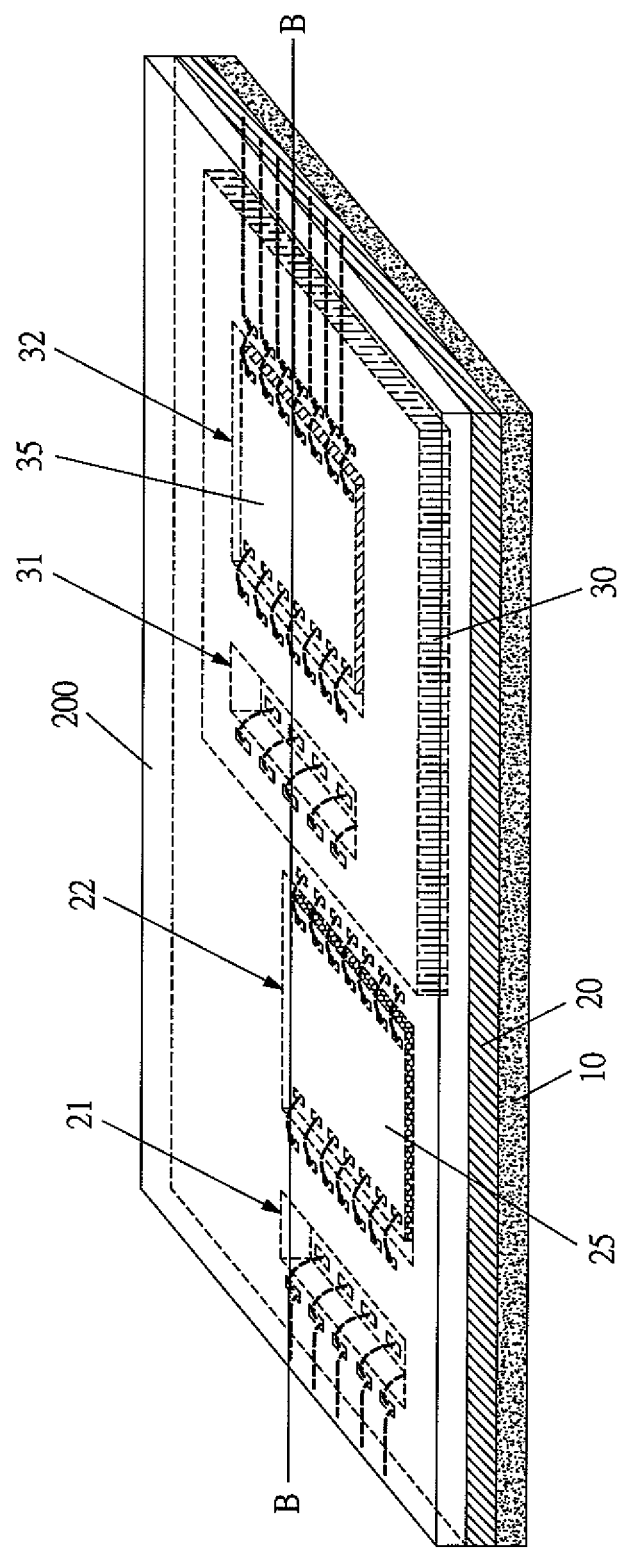
FIG. 4 is an assembled schematic view of the elements in the second embodiment of the present invention.
Figure 5:
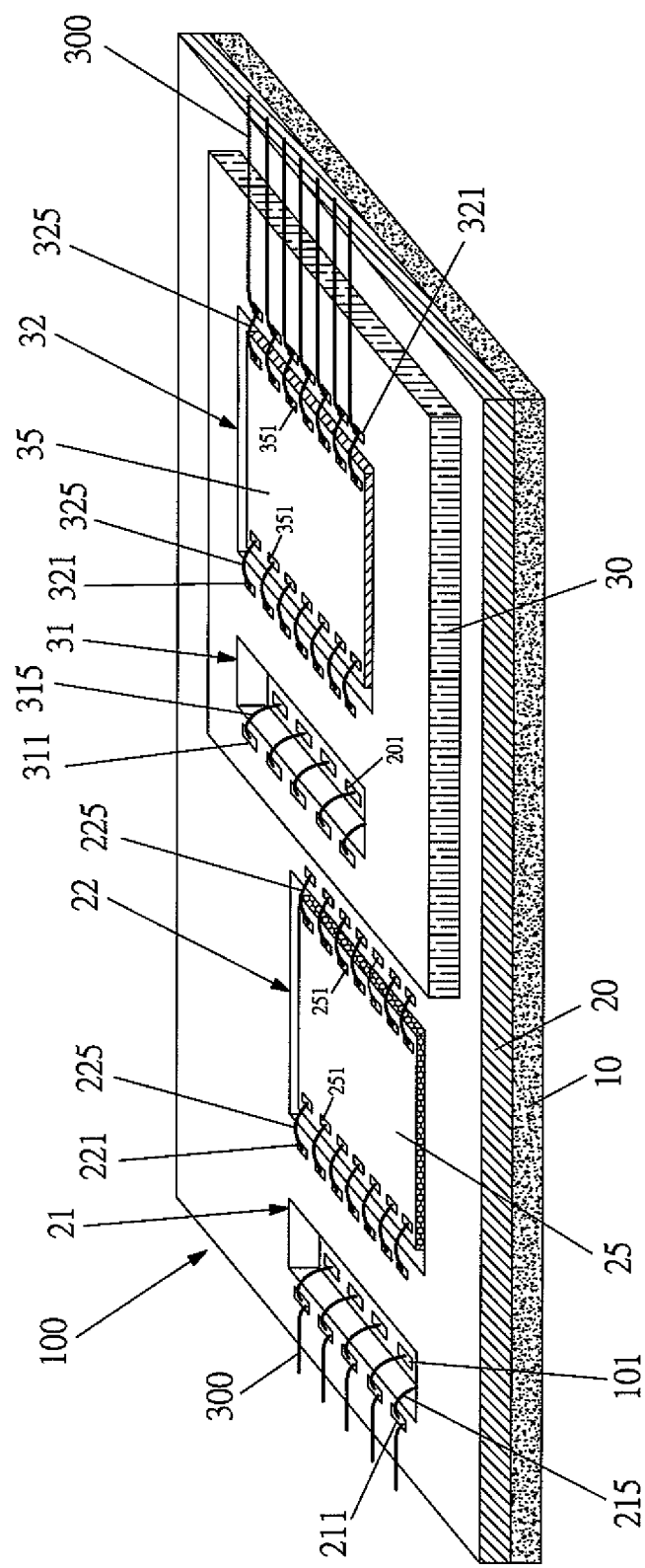
FIG. 5 is a schematic view showing the layout of the chipset in the second embodiment of the present invention.
Figure 6:
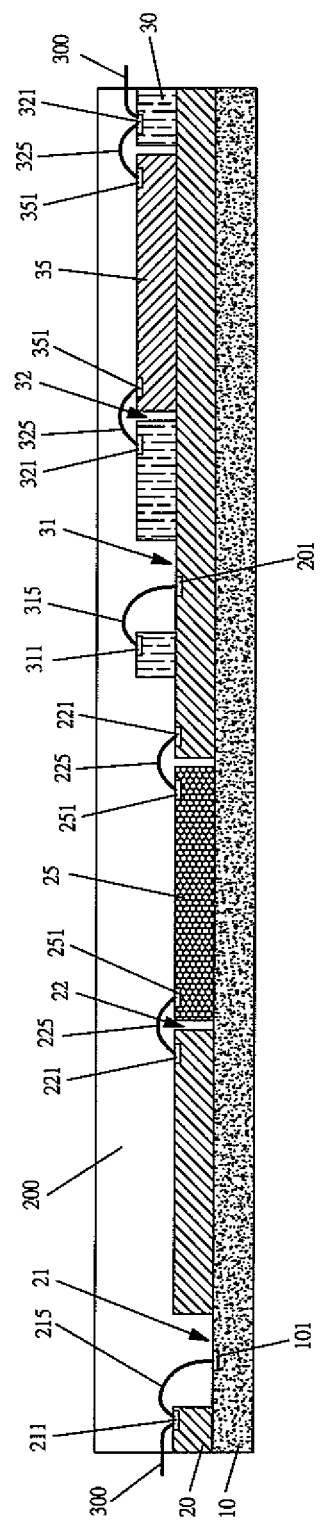
FIG. 6 is a schematic view viewed from line B-B in FIG. 4.

With reference to FIGS. 1 to 3, the first embodiment about the multiple chip packaging structure according to the present invention is illustrated. The structure comprises the following elements.

A chip circuit layer 100 contains the following elements.

A first chip 10 has a plurality of welding pads 101 on a surface thereof for connecting external conducting wires. For example, the first chip 10 may be a NAND flash chip.

A first circuit board 20 is positioned above the first chip 10. The first circuit board 20 includes at least one wiring opening 21 and at least one chipset opening 22. After the first circuit board 20 is combined with the first chip 10, the welding pads 101 on the first chip 10 exposes out from the wiring opening 21.

The first chipset 25 is placed in the chipset opening 22. The first chipset 25 is, for example, a controller. The first chipset 25 is arranged with a plurality of welding pads 251.

After the first circuit board 20 is combined with the first chip 10, the first chipset 25 exposes out from the chipset opening 22. As illustrated in FIG. 2, the chipset opening 22 is aside the wiring opening 21. However, this arrangement is only one example for description of the invention. The arrangement of the chipset opening 22 and the wiring opening 21 may be another forms. All these are within the scope of the present invention.

The first circuit board 20 is formed with a plurality of welding pads 211 near the wiring opening 21. Conducting wires 215 are connected between the welding pads 101 of the first chip 10 and the welding pads 211 of the first circuit board 20 so as to have the function of power and signal connections.

The first circuit board 20 is formed with a plurality of welding pads 221 near the chipset opening 22. Conducting wires 225 serve to connect the welding pads 221 of the chipset opening 22 and the welding pads 251 of the first chipset 25 so as to have the functions of power and signal connection.

A set of outward conduction wires 300 have one ends connected to the welding pads 211 of the first circuit board 20 and another end connected to external devices. The connection of the outward conduction wires 300 is only one example and thus not used to confine the scope of the present invention. Preferably, the conduction wires 300 are gold wires with a preferred extension and wear enduring property.

A packaging layer 200 is above the chip circuit layer 100. The packaging layer 200 encloses the chip circuit layer 100 for protection the chip circuit layer 100.

With reference to FIGS. 4 to 7, another embodiment of the present invention is illustrated. The same elements as those shown in the first embodiment are not described herein.

The chip circuit layer 100 further comprises:

At least one second circuit board 30 is installed above the first circuit board 20. The second circuit board 30 includes at least one wiring opening 31 and at least one chipset opening 32. The wiring opening 31 of the second circuit board 30 serves to expose the welding pads 201 of the first circuit board 20 after the second circuit board 30 combines with the first circuit board 20.

A second chipset 35 is arranged on the chipset opening 32 of the second circuit board 30. The second chipset 35 is arranged with a plurality of welding pads 351.

The second chipset 35 exposes out from the chip set opening 32 of the second circuit board 30 after the second circuit board 30 is combined with the first circuit board 20. As illustrated in FIG. 2, the chip set opening 32 of the second circuit board 30 is at the same side as that locating the wiring opening 31 of the second circuit board 30. However, this is used as an example for description of the invention. The wiring opening 31 and the chip set opening 32 of the second circuit board 30 may be arranged by another ways.

A plurality of welding pads 311 are arranged on the second circuit board 30 near the wiring opening 31 of the second circuit board 30. Conducting wires 315 serve to connect the welding pads 311 with the welding pads 301 of the first circuit board 20 for signal and electrical connections.

A plurality of welding pads 321 are arranged on the second circuit board 30 near the chipset opening 32 of the second circuit board 30. Conducting wires 325 serve to connect the welding pads 321 with the welding pads 351 of the second chipset 35 for signal and electrical connections.

At least one outwards extending conducting wire 300 having one end connected to welding pads 321 of the second circuit board 30 and another end extending out of the second circuit board 30 for connecting with external devices. In this example, the outwards extending conducting wires 300 is connected with the second circuit board 300 by using the welding pads 311, 321. However, the connection of the outwards extending conducting wire 300 and the second circuit board 30 are not confined to those shown in the drawings, other arrangements are still effective. Preferably, the outwards extending conducting wire 300 is a golden wire with preferred extension property and endurance for wearing.

Preferably, in the present invention, the conducting wires 215, 225, 315 and 325 are copper wires which has the advantage of low cost.

Figure 7:
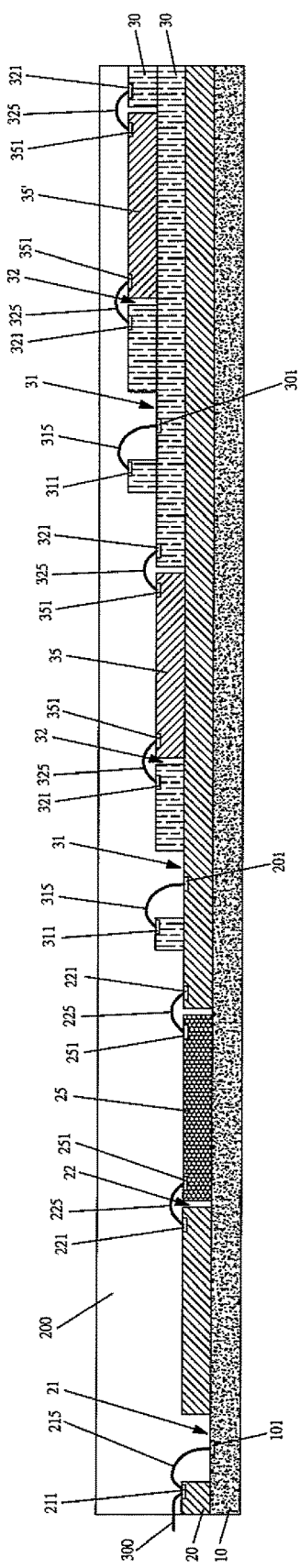
FIG. 7 is a cross sectional view in the first embodiment of the present invention.

As illustrated in FIG. 7, the at least one second circuit board 30 includes a plurality of second circuit boards. Each of the second circuit board 30 is overlapped with one another so as to form with a multi-layer structure. Each second circuit board has an opening and respective welding pads on the upper surface thereof. Conductive wires are used to connect welding pads on the second circuit board 30 on an upper side and welding pads of the second circuit board 30 on a lower side through the opening of the second circuit board 30 on an upper side. Another chipset 35 is placed in the opening of the second circuit board 30.

Advantages of the present invention are that the chips can be arranged in a stacking structure with multilayer circuit board. Each circuit board is formed with wiring opening and chipset opening. The chipset opening can be arranged with at least one chipset, such as a controller. The different openings cause connecting wires can pass therethrough so as to connect different chips or circuit elements on different layer. By this modularized structure, the multilayer package structure can be formed with a complicated structure in one package so as to reduce the packaging cost effectively.

Furthermore, in the present invention, the connecting wires pass through the openings so as to reduce the whole path lengths needed. No complicated wiring is needed. In the present invention, all the conducting wires are at an upper side of the chips. In packaging, it only needs to package the upper side (such as sealing with epoxy). Packaging at other sides may be neglected. Therefore the whole structure is simple and thin. The packing cost is low and work is easy. As a result, many circuit elements expose out so that heat dissipation is good.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:
1. A multilayer chipset structure comprising:
a chip circuit layer (100) containing:

a first chip (10) having a plurality of welding pads (101) on a surface thereof for connecting external conducting wires;

a first circuit board (20) being positioned on the first chip (10); the first circuit board (20) including at least one wiring opening (21) and at least one chipset opening (22); after the first circuit board (20) being combined with the first chip (10), the welding pads (101) on the first chip (10) exposing out from the wiring opening (21);

a first chipset (25) being placed in the chipset opening (22); the first chipset being arranged with a plurality of welding pads (251); after the first circuit board (20) being combined with the first chip (10), the first chipset (25) exposing out from the chipset opening (22); and wherein the first circuit board (20) is formed with a plurality of welding pads (211) near the wiring opening (21) of the first circuit board (20); first conducting wires (215) are connected between the welding pads (101) of the first chip (10) and the welding pads (211) of the first circuit board (20) so as to have the function of power and signal connections; and the first circuit board (20) is formed with a plurality of welding pads (221) near the chipset opening (22); second conducting wires (225) serving to connect the welding pads (221) of the first circuit board (20) and the welding pads (251) of the first chipset (25) so as to have the functions of power and signal connection; and the chip circuit layer (100) further comprises:

at least one second circuit board (30) being installed above the first circuit board (20); the second circuit board (30) including at least one wiring opening (31) and at least one chipset opening (32); the wiring opening (31) of the second circuit board (30) serving to expose the welding pads (201) of the first circuit board (20) after the second circuit board (30) combines with the first circuit board (20);

a second chipset (35) being arranged in the chipset opening (32) of the second circuit board (30); the second chipset (35) being arranged with a plurality of welding pads (351); the second chipset (35) exposing out from the chip set opening (32) of the second circuit board (30) after the second circuit board (30) is combined with the first circuit board (20);

wherein a plurality of welding pads (311) are arranged on the second circuit board (30) near the wiring opening (31) of the second circuit board (30); third conducting wires (315) serving to connect the welding pads (311) on the second circuit board (30) with the welding pads (301) of the first circuit board (20) for signal and electrical connections; and a plurality of welding pads (321) are arranged on the second circuit board (30) near the chipset opening (32) of the second circuit board (30); fourth conducting wires (325) serving to connect the welding pads (321) on the second circuit board with the welding pads (351) of the second chipset (35) for signal and electrical connections.

2. The multilayer chipset structure as claimed in claim 1, further comprising: a packaging layer being on and enclosing the chip circuit layer (100) for protecting the chip circuit layer.

3. The multilayer chipset structure as claimed in claim 1, wherein there are a plurality of second circuit boards (30); each of the second circuit board (30) is overlapped with one another so as to form with a multi-layer structure; each second circuit board has an opening and respective welding pads on an upper surface thereof; fifth conductive wires are used to connect welding pads on the second circuit board on an upper side and welding pads of the second circuit board on a lower side through the opening of the second circuit board on an upper side.

4. The multilayer chipset structure as claimed in claim 3, wherein another chipset (35) is placed in the opening of the second circuit board (30) on the upper side.

5. The multilayer chipset structure as claimed in claim 1, wherein the first chip is a NAND Flash chip.

6. The multilayer chipset structure as claimed in claim 1, wherein the first conductive wires are copper wires.

7. The multilayer chipset structure as claimed in claim 1, further comprising at least one outwards extending conducting wire (300) having one end connected to welding pads (321) of the second circuit board (30) and another end extending out of the second circuit board (30) for connecting with external devices.

8. The multilayer chipset structure as claimed in claim 7, wherein the outwards extending conductive wires are gold wires.

9. The multilayer chipset structure as claimed in claim 1, wherein the first chipset is a controller.

* * * * *